(12) United States Patent
Gupta et al.

(10) Patent No.: US 9,325,324 B1
(45) Date of Patent: Apr. 26, 2016

(54) PHASE LOCKED LOOP (PLL) CIRCUIT WITH COMPENSATED BANDWIDTH ACROSS PROCESS, VOLTAGE AND TEMPERATURE

(71) Applicant: STMicroelectronics International N.V., Amsterdam (NL)

(72) Inventors: Nitin Gupta, Noida (IN); Anand Kumar, Noida (IN); Abhirup Lahiri, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/573,002

(22) Filed: Dec. 17, 2014

(51) Int. Cl.
| | | |
|---|---|---|
| *H03L 7/00* | (2006.01) | |
| *H03L 1/02* | (2006.01) | |
| *H03L 7/093* | (2006.01) | |
| *H03L 7/18* | (2006.01) | |
| *H03L 7/099* | (2006.01) | |
| *H03L 7/107* | (2006.01) | |

(52) U.S. Cl.
CPC *H03L 1/02* (2013.01); *H03L 7/093* (2013.01); *H03L 7/099* (2013.01); *H03L 7/0995* (2013.01); *H03L 7/1072* (2013.01); *H03L 7/18* (2013.01)

(58) Field of Classification Search
CPC .......... H03L 7/099; H03L 7/18; H03L 7/1072
USPC ................ 331/57, 16, 34, 183, 176
See application file for complete search history.

(56) References Cited

U.S. PATENT DOCUMENTS

| 7,312,663 | B2 | 12/2007 | Abel | |
|---|---|---|---|---|
| 7,546,097 | B2* | 6/2009 | Dunworth | H03L 7/0898 455/124 |
| 2012/0212300 | A1* | 8/2012 | Tang | H03B 5/1228 331/117 FE |

* cited by examiner

*Primary Examiner* — Arnold Kinkead
(74) *Attorney, Agent, or Firm* — Gardere Wynne Sewell LLP

(57) ABSTRACT

A phase locked loop (PLL) circuit includes a phase comparison circuit configured to compare phase of an input signal to phase of a feedback signal and generate a control signal responsive to the phase comparison and an oscillator circuit configured to generate an output signal at a frequency set by said control signal, where said feedback signal is derived from said output signal. The PLL circuit further operates in a calibration mode of operation wherein the oscillator circuit operates in a frequency locked loop mode to compare frequency of the input signal to frequency of the output signal and center a gain of the oscillator circuit across process, voltage and temperature in response to the frequency comparison. Furthermore, bias current for a charge pump within the phase comparison circuit is calibrated during calibration mode of operation to match a temperature independent reference current.

24 Claims, 2 Drawing Sheets

PHASE LOCKED LOOP (PLL) CIRCUIT WITH COMPENSATED BANDWIDTH ACROSS PROCESS, VOLTAGE AND TEMPERATURE

TECHNICAL FIELD

The present invention relates to a phase locked loop (PLL) circuit and, in particular, to a circuit and process for bandwidth compensation in a PLL circuit.

BACKGROUND

Analog phase locked loop (PLL) circuits are well known in the art. Such circuits typically include a charge pump, a loop filter and a ring oscillator. The bandwidth of the PLL circuit is dependent on the charge pump current, the resistance in the loop filter and the gain of the voltage controlled oscillator (VCO) which is generally referred to as KVCO gain. In many implementations the changes in current and resistance compensate each other, and so the spread of the PLL circuit bandwidth is primarily determined by the variation in KVCO gain.

Change in the bandwidth of the PLL circuit produces a corresponding change in integrated jitter values which adversely affect the cut-off frequency of the PLL circuit high pass filter function that shapes VCO noise. It is therefore important to keep the PLL bandwidth constant with process, voltage and temperature variation (referred to PVT variation) in order to achieve satisfactory integrated jitter numbers, improve PLL circuit stability and better control lock time of the PLL circuit. This design goal must be accomplished with minimal impact on VCO phase noise. For example, an increase in phase noise can be better shaped with a constant bandwidth PLL circuit.

There is accordingly a need in the art for a compensated PLL circuit exhibiting a stable bandwidth over a range of temperature variation.

SUMMARY

In an embodiment, a phase locked loop (PLL) circuit comprises: a phase comparison circuit configured to compare phase of an input signal to phase of a feedback signal and generate a control signal responsive to the phase comparison; an oscillator circuit configured to generate an output signal at a frequency set by said control signal, where said feedback signal is derived from said output signal; wherein the oscillator circuit is configured to operate in a frequency locked loop (FLL) mode during a calibration mode of operation to compare frequency of the input signal to frequency of the output signal and center a gain of the oscillator circuit across process, voltage and temperature in response to the frequency comparison.

In an embodiment, a method of operating a phase locked loop (PLL) circuit comprises: operating the PLL circuit in a first mode of operation by: comparing a phase of an input signal to phase of a feedback signal; generating a control signal in response to the phase comparison; and setting a frequency of an output signal generated by an oscillator circuit in response to said control signal; wherein said feedback signal is derived from said output signal; and operating the PLL circuit if a second mode operation by: controlling the oscillator circuit to operate in a frequency locked loop (FLL) mode to compare frequency of the input signal to frequency of the output signal; and centering a gain of the oscillator circuit across process, voltage and temperature in response to the frequency comparison.

BRIEF DESCRIPTION OF THE DRAWINGS

For a better understanding of the embodiments, reference will now be made by way of example only to the accompanying figures in which.

DETAILED DESCRIPTION OF THE DRAWINGS

A phase locked loop (PLL) is a circuit that generates a periodic output signal, for example a clock signal, having a constant phase relationship with respect to a periodic input (reference clock) signal. The PLL circuit is a closed loop frequency control system that operates to detect the phase difference between the input and output signals and then adjust the operation of the output signal generator to drive the phase difference to zero.

Figure 1:
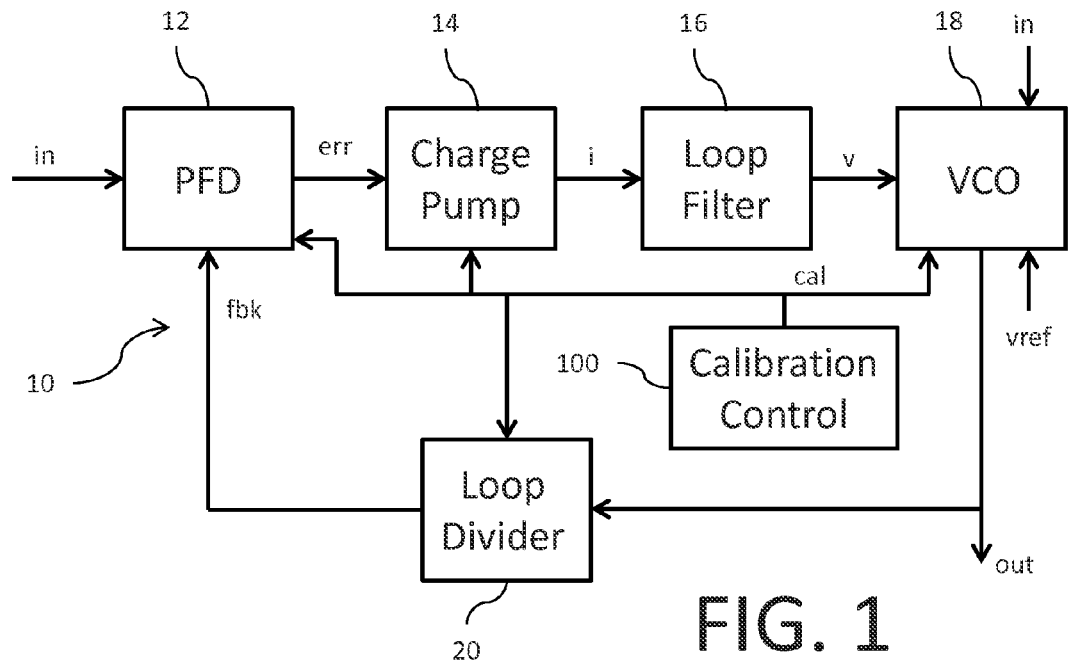
FIG. 1 is a block diagram of a phase locked loop (PLL) circuit.

Reference is now made to FIG. 1 showing a block diagram of a phase locked loop (PLL) circuit 10. The PLL circuit includes a phase/frequency detector (PFD) circuit 12, a charge pump circuit 14, a loop filter circuit 16, an oscillator circuit 18 (for example, of the voltage-controlled oscillator (VCO) or current-controlled oscillator (CCO) type), and a frequency divider circuit (loop divider) 20. The PFD circuit 12 measures the difference in phase between an input signal (in) and a feedback signal (fbk). The PFD circuit 12 generates an error signal (err) that is proportional to the measured phase difference. The charge pump circuit 14 generates an output current (i) that is proportional to the error signal. The charge pump output current is input to the loop filter circuit 16, and the loop filter circuit outputs a corresponding control voltage (v) that is applied to a control input of the VCO circuit 18. The frequency of the output signal (out) generated by the VCO circuit 18 is dependent on the control voltage output from the loop filter circuit 16. The frequency divider circuit 20 receives the output signal and generates the feedback signal.

It will be noted that in an embodiment, the frequency divider circuit 20 may be omitted and the feedback signal (fbk) may comprise the output signal (out) generated by the VCO circuit 18. In such a case, the frequency of the output signal (out) will equal the frequency of the input signal (in). With the inclusion of the frequency divider circuit 20 implementing a frequency divisor of D, for example, the frequency of the output signal (out) will equal D times the frequency of the input signal (in). In either case, the PLL operation will lock the phase of the output signal to the phase of the input signal.

In operation of the PLL circuit 10, the loop characteristics are such that the phase and frequency of the feedback signal derived from the PLL circuit output signal will exactly equal the frequency and phase of the input signal. In this condition, the PLL circuit 10 is said to be "locked" or to have achieved a "phase lock." Once the PLL circuit is locked, if the phase of the input signal were to vary over time, then the phase of the output signal would track that variation, thus keeping the phase of the feedback signal equal to the phase of the input signal.

The jitter transfer function of a PLL circuit measures the ability of the circuit to track variation in the phase of the input signal. It is known that the PLL jitter transfer function exhibits a low pass frequency response characteristic that is defined by the closed loop bandwidth of the PLL circuit. Thus, the PLL circuit will better track low frequency variation in the phase of the input signal. Higher frequency variations are less well tracked and may not be tracked at all. The closed loop bandwidth thus provides an indication of an upper limit of the input phase modulation frequency which can be fully tracked by the PLL circuit.

The closed loop bandwidth further quantifies the ability of the PLL circuit to attenuate random noise originating within the oscillator circuit 18. For example, VCO phase noise is attenuated at frequencies below the PLL loop bandwidth. Because the phase noise contributed by the oscillator circuit 18 is a significant source of jitter, it is desirable to maximize the PLL loop bandwidth. Importantly, this maximized loop bandwidth must also be stable over process, voltage and temperature variation.

Figure 2:
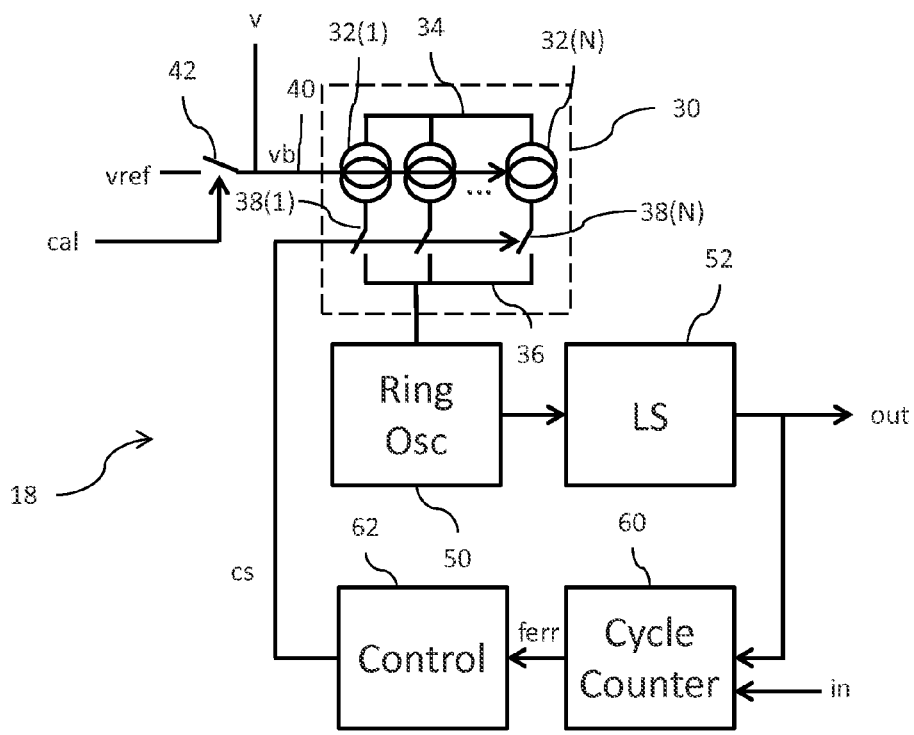
FIG. 2 is a block diagram of an oscillator circuit within the PLL circuit of FIG. 1.

Reference is now made to FIG. 2 showing a block diagram of the oscillator circuit 18 used within the PLL circuit of FIG. 1. In this implementation, the oscillator circuit 18 comprises a voltage controlled oscillator (VCO).

The VCO circuit 18 includes a variable current source circuit 30 formed by a plurality of current sources 32 coupled in parallel between a supply node 34 and a first intermediate node 36. Each current source 32 is biased by a same bias voltage (vb) provided at a bias node 40 and referenced to supply node 34 in order to generate a current whose magnitude is dependent on the applied bias voltage and the number of current sources that are actuated to supply current to node 36. A switch circuit 38 coupled in series with each current source 32 controls whether the current generated at each current source is provided to node 36. The switch circuits 38 are actuated in response to a received switch control signal (cs).

In an embodiment, the current source 32 and switch circuit 38 may each be formed by a MOSFET transistor. In such a configuration, the bias voltage is applied to a gate terminal of the MOSFET forming the current source and the control signal is applied to a gate terminal of the MOSFET forming the switch circuit. As noted above, each of the included current sources 32 is biased by the same bias voltage (vb). The source-drain paths of the two MOSFETs are coupled in series between the supply node 34 and first intermediate node 36.

In an embodiment, there may be N current sources 32(1)-32(N) and correspondingly N switch circuits 38(1)-38(N).

The bias node 40 (forming the control input of the oscillator 18) is coupled to the output of the loop filter circuit 16 (FIG. 1) to receive the loop filter output voltage (v). The bias node is further selectively coupled through a switch 42 to receive a reference voltage (vref) that is also referenced to the supply node 34. Thus, when the switch 42 is open, the current sources 32 of the variable current source circuit 30 are biased by the loop filter output voltage (v). Conversely, when the switch 42 is closed, the current sources 32 of the variable current source circuit 30 are biased by the reference voltage (vref). The actuation of the switch 42 is controlled by a calibration signal (cal).

The VCO circuit 18 further includes a ring oscillator (Osc) circuit 50 having any suitable configuration well known to those skilled in the art. The supply terminal of the ring oscillator circuit 50 is coupled to the intermediate node 36. Thus, the ring oscillator circuit 50 is biased from the intermediate node 36 to function as a current controlled oscillator (CCO), and the frequency of oscillation of the ring oscillator circuit 50 is therefore dependent on the magnitude of the current supplied by the plurality of current sources 32 within the variable current source circuit 30.

A level shifter (LS) circuit 52 is coupled to the output of the ring oscillator circuit 50. The LS circuit 52 functions to shift the voltage level of the generated frequency signal and generate the output signal (out) from the VCO circuit 18.

The VCO circuit 18 further includes a frequency locked loop (FLL) circuit functionality. The signal (out) generated by the VCO circuit 18 at the output of the LS circuit 52 is applied to a first input of a cycle counter circuit 60. The input signal (in) is applied to a second input of the cycle counter circuit 60. The cycle counter circuit 60 functions to compare the frequency of the output signal (out) to the input signal (in) and generate an error signal (ferr) that is proportional to the measured difference in frequency. A control circuit 62 converts the error signal (ferr) to generate the switch control signal (cs). This closed loop operation functions to individually control the turning on/off of the switch circuits 38 so as to select the magnitude of the current output from the variable current source circuit 30 and therefore adjust the biased operation of the ring oscillator circuit 50. By selectively actuating the switch circuits 38 in response to the error signal (ferr), the control circuit 62 drives the frequency of the signal (out) to match the frequency of the signal (in).

When the frequency locked loop (FLL) circuit functionality is activated (in response to an active logic state of the calibration signal (cal)), the switch 42 is closed and the current sources 32 of the variable current source circuit 30 are biased by the reference voltage (vref). The magnitude of the current output at intermediate node 36 is thus a function of the bias voltage and the number of current sources 32 selected for output by switch circuits 38 in response to the switch control signal (cs). The frequency of the output signal (out) depends on the current at node 36. Through the feedback loop, the current at node 36 is modulated and a lock of frequency to the input signal (in) is achieved. This results in a calibration of the transconductance of the variable current source circuit 30 supplying the ring oscillator (CCO) circuit 50. With that calibration, the gain of the oscillator circuit 18 (KVCO) is centered across process, voltage and temperature. By this it is meant that there is one value of KVCO across all temperatures.

With reference once again to FIG. 1, the phase/frequency detector (PFD) circuit 12 and frequency divider circuit 20 of the PLL circuit 10 are deactuated by the active logic state of the calibration signal (cal)). This ensures that the PLL control loop is not active during calibration mode.

Following a successful transconductance calibration, the frequency locked loop (FLL) circuit functionality is deactivated (in response to a deactive logic state of the calibration signal (cal)), and the phase/frequency detector (PFD) circuit 12 and frequency divider circuit 20 of the PLL circuit 10 are actuated. The switch 42 is opened and the control signal (cs) selected current sources 32 of the variable current source circuit 30 are now instead biased by the loop filter output voltage (v). The PLL control loop then takes over with respect to the generation of the output signal (out). It will be noted that the ones of the current sources 32 selected by the switch control signal (cs) will remain actuated without change in number during PLL mode for generation of the bias current supplying the ring oscillator (CCO) circuit 50. At this point, variation in bias current for the ring oscillator will depend only on the control voltage (v) output from the loop filter 16. The gain KVCO of the oscillator will now exhibit a temperature profile that is complementary to absolute temperature (CTAT).

Figure 3:
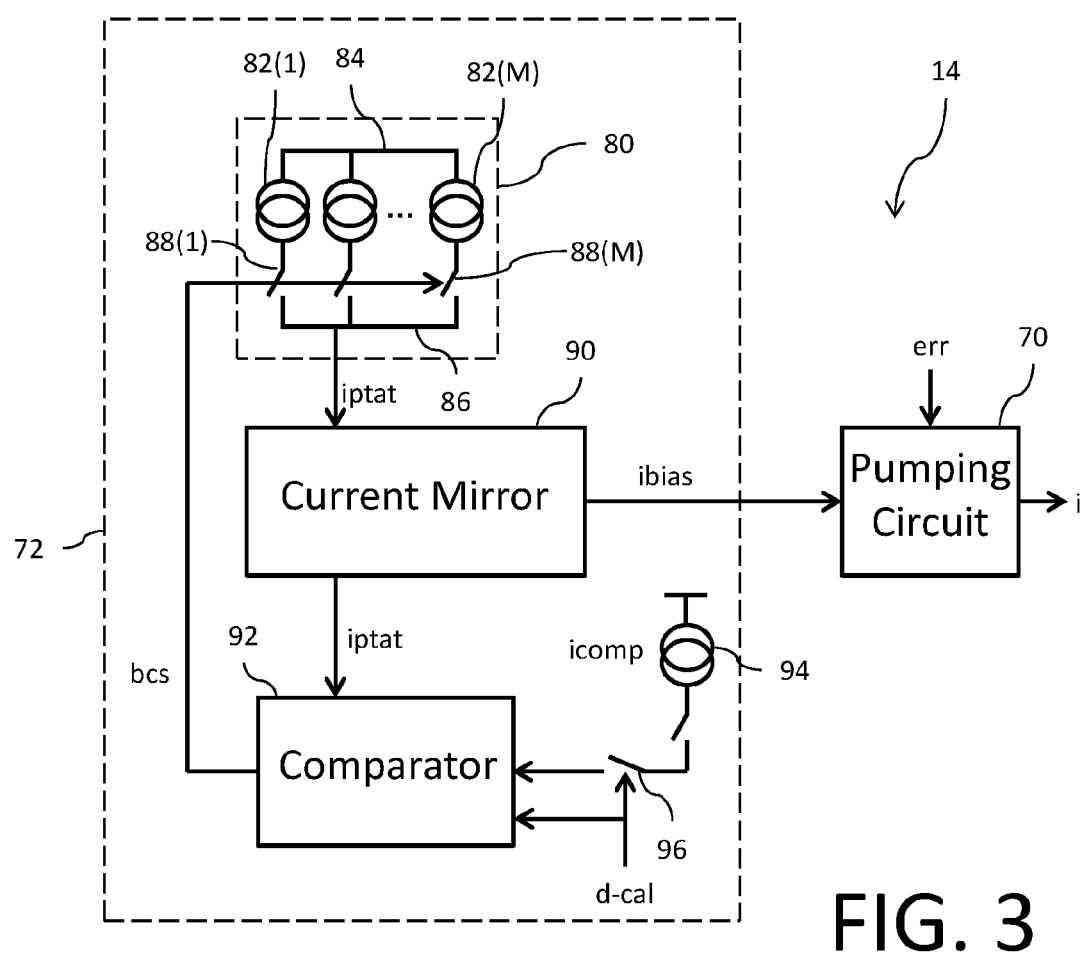
FIG. 3 is a block diagram of a charge pump circuit within the PLL circuit of FIG. 1.

Reference is now made to FIG. 3 showing a block diagram of the charge pump circuit 14 within the PLL circuit of FIG. 1. The charge pump circuit 14 includes a pumping circuit 70 that receives the error signal (err) and generates the current (i) proportional to this error signal. The charge pump circuit further includes a bias current generator circuit 72 that generates a bias current (ibias) that is applied to the pumping circuit 70 and used to generate the current (i). The details of the pumping circuit 70 are not illustrated as such circuits are well known to those skilled in the art.

The bias current generator circuit 72 includes a variable current source circuit 80 formed by a plurality of current sources 82 coupled in parallel between a supply node 84 and a second intermediate node 86. Each current source 82 is biased in a conventional manner to generate a current with a temperature profile that is proportional to absolute temperature (PTAT). A switch circuit 88 coupled in series with each current source 82 controls whether the generated PTAT current is output in response to a received bias switch control signal (bcs) and applied to node 86. The sum of the currents at second intermediate node 86 form a PTAT current (iptat).

The bias current generator circuit 72 further includes a current mirror circuit 90 configured to mirror the PTAT current (iptat) with a desired ratio and generate the bias current (ibias) that is applied to the pumping circuit 70.

The bias current generator circuit 72 also includes a comparator circuit 92. The comparator circuit 92 includes a first input configured to receive the PTAT current (iptat) and a second input configured to selectively receive a compensated current (icomp). The compensated current (icomp) is generated by a current source 94 that is configured to generate a current having a fixed magnitude that is temperature independent. The design of such a current source (for example using a PTAT circuit in combination with a CTAT (complementary to absolute temperature) circuit; i.e., a PTAT+CTAT current generator circuit) is well known to those skilled in the art. The output of the current source 94 is coupled to the second input of the comparator circuit 92 through a switch circuit 96. The actuation of the switch 96 is controlled by a time delayed version (d-cal) of the calibration signal (cal). For example, in an embodiment, time delay may comprise one cycle of the signal (in). The comparator circuit 92 further includes an enable input configured to receive the delayed calibration signal (d-cal).

After expiration of the time delay (for example, one cycle) following activation of the frequency locked loop (FLL) circuit functionality (in response to an active logic state of the calibration signal (cal)), the switch 96 is closed by the signal d-cal and the comparator circuit 92 is enabled for operation. The magnitude of the PTAT current (iptat) output at intermediate node 86 is a function of the number of current sources 82 selected for output by switch circuits 88 in response to the bias switch control signal (bcs). The comparator circuit 92 functions to measure a difference in current magnitude between the compensated current (icomp) and the PTAT current (iptat) and generate the bias switch control signal (bcs) that selects the active current sources 82 and controls the magnitude of the PTAT current output at intermediate node 86. This closed loop operation functions to individually control the turning on/off of the switch circuits 88 so as to select the magnitude of the PTAT current (iptat) output from the variable current source circuit 80 to match the magnitude of the compensated current (icomp).

Although comparator circuit 92 is described as a current comparator, it will be understood that any suitable form of comparison or differential amplification circuitry could be used.

As discussed above, the phase/frequency detector (PFD) circuit 12 and frequency divider circuit 20 of the PLL circuit 10 are deactuated by the active logic state of the calibration signal (cal)). Following successful circuit calibration, the frequency locked loop (FLL) circuit functionality is deactivated (in response to a deactive logic state of the calibration signal (cal)), and the phase/frequency detector (PFD) circuit 12 and frequency divider circuit 20 of the PLL circuit 10 are actuated. After the time delay, the switch 96 is opened and the comparator circuit 92 is disabled. The ones of the current sources 82 selected by the bias switch control signal (bcs) will remain actuated during PLL mode for generation of the PTAT current (iptat) output from the variable current source circuit 80.

Reference is now made to FIG. 1. The PLL circuit 10 includes a calibration control circuit 100 that is configured to generate the calibration signal (cal) and thus control operation of the circuit 10 in switching between PLL mode and calibration mode. The delayed calibration signal (d-cal) may be generated by the circuit 100 or generated at the charge pump circuit 14. The calibration control circuit 100 may be configured to control circuit 10 operation such that calibration mode is entered into at each circuit start-up. Alternatively, or additionally, the calibration control circuit 100 may be configured to control circuit 10 operation such that calibration mode is entered into on a periodic basis. Still further, alternatively or additionally, the calibration control circuit 100 may be configured to control circuit 10 operation such that calibration mode is entered into on an event driven basis.

When in calibration mode, the calibration signal (cal) is forced by circuit 100 to an active logic state. In response to the active logic state of the calibration signal (cal), certain PLL circuit components are disabled. For example, the phase/frequency detector (PFD) circuit 12 and frequency divider circuit 20 of the PLL circuit 10 are deactuated, and thus the output signal (out) generated by the oscillator circuit 18 will not be phase locked to the input signal (in). The oscillator circuit 18 responds to the active logic state of the calibration signal (cal) by entering a frequency locked loop (FLL) mode of operation in which the output signal (out) generated by the oscillator circuit 18 is frequency locked to the in signal (in). During FLL mode, the number of current sources 32 actuated to supply bias current to the ring oscillator circuit 50 (i.e., the magnitude of that variable bias current) is calibrated in response to a reference voltage in order to cancel the process, voltage and temperature effect on VCO gain (KVCO).

In further response to the active logic state of the calibration signal (cal), the number of current sources 82 actuated to supply a bias current (ibias) to a pumping circuit 70 of the charge pump 14 (i.e., the magnitude of that variable bias current) is calibrated to match a PTAT current (iptat) output from the current sources 82 to a compensated current (icomp) which is temperature independent.

The circuit then exits from calibration mode, and the calibration control circuit 100 forces the calibration signal (cal) to an inactive logic state. The oscillator circuit 18 exits from the frequency locked loop (FLL) mode of operation and the PLL circuits begins operation in the PLL mode. The phase/frequency detector (PFD) circuit 12 and frequency divider circuit 20 of the PLL circuit 10 are actuated, and PLL loop control causes the output signal (out) generated by the oscillator circuit 18 to phase lock to the in signal (in). In this regard, it will be noted that frequency lock has already been established by the prior operation in FLL mode, and thus the time needed to achieve phase lock can be reduced in comparison to prior art PLL mode circuits. During PLL mode, the number of number of current sources 32 actuated to supply bias current to the ring oscillator circuit 50 set by calibration in FLL mode does not change, but the magnitude of the current supplied by those current sources will change in response to the loop filter output control voltage (v). In the charge pump circuit 14, the number of number of current sources 82 actuated to supply bias current to the pumping circuit 70 does not change, but the magnitude of the charge pump bias current will be PTAT. In prior art PLL circuits, this would adversely affect PLL bandwidth. In the PLL circuit 10, however, this is not of concern because the VCO gain (KVCO) in PLL mode has been configured to be CTAT and thus the temperature variations will offset resulting in a stable closed loop bandwidth for the PLL circuit 10.

Although the example embodiment described above focuses on an oscillator exhibiting a CTAT gain that is offset by a PTAT bias current generated for the charge pump, it will be understood that this functionality can be designed to address other circuit behavior. What is important is that temperature dependent profile of the charge pump bias current offset (cancel/compensate for) the temperature dependent profile of the oscillator gain.

To better understand the functionality of the embodiment, consider that if there is no change in temperature during PLL mode of operation, the closed loop bandwidth for the PLL circuit 10 will be constant if the charge pump bias current (ibias) also remains constant. However, if the temperature changes during PLL mode of operation, the gain (KVCO) of the oscillator circuit 18 will inversely change with respect to that temperature change (i.e., the gain is CTAT). In this case, if the charge pump bias current (ibias) were to remain constant, there will be a change in the closed loop bandwidth for the PLL circuit 10 as a result of the change in KVCO. In order to keep the closed loop bandwidth for the PLL circuit 10 constant, however, the charge pump bias current (ibias) can be made to proportionally change with temperature (PTAT) and thus the KVCO value will not change and the bandwidth is stabilized.

The implementation described above provides a circuit which tracks KVCO/fVCO, and thus the KVCO value will track changes in VCO frequency. Because of this fact, the PLL circuit 10 does not need complicated circuitry or programming in the charge pump circuit 14 to track changes in the VCO frequency. Still further, because further circuitry is needed, the PLL circuit 10 does not introduce an additional source of phase noise.

The stable, substantially constant, PLL bandwidth means that the PLL circuit 10 functions better that prior art circuits in terms of shaping VCO noise and is more stable. Also, because the calibration mode operation functions to center the transconductance of the current generator circuit in the VCO, the PLL circuit 10 exhibits improved open-loop phase noise with respect to the VCO in fast corner.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A phase locked loop (PLL) circuit, comprising:
 a phase comparison circuit configured to compare phase of an input signal to phase of a feedback signal and generate a control signal responsive to the phase comparison;
 an oscillator circuit configured to generate an output signal at a frequency set by said control signal, where said feedback signal is derived from said output signal;
 wherein the oscillator circuit comprises a variable current source comprising a plurality of selectively actuated current source circuits each biased by a bias signal;
 wherein the oscillator circuit is configured to operate in a frequency locked loop (FLL) mode during a calibration mode of operation to compare frequency of the input signal to frequency of the output signal and center a gain of the oscillator circuit across process, voltage and temperature in response to the frequency comparison; and
 wherein the bias signal comprises a reference voltage during the calibration mode of operation and the voltage of the control signal when not in the calibration mode of operation.

2. The PLL circuit of claim 1, wherein the calibration mode of operation operates to calibrate a transconductance of the variable current source.

3. The PLL circuit of claim 1, wherein a current signal output from the selectively actuated current source circuits is configured to bias a supply terminal of a current controlled oscillator configured to generate the output signal.

4. The PLL circuit of claim 1, wherein each current source circuit comprises a current source and a switch coupled in series with each other, said switch controlled to select actuation of the current source circuit.

5. The PLL circuit of claim 1, where the oscillator circuit further comprises an FLL control loop configured to receive the output signal and input signal for comparison and generate a signal that controls the selective actuation of the current source circuits.

6. The PLL circuit of claim 1, wherein a number of the current source circuits selectively actuated during the calibration mode of operation remain actuated when not in the calibration mode of operation.

7. The PLL circuit of claim 1, wherein the phase comparison circuit comprises:
 a phase/frequency detector circuit configured to compare phase of an input signal to phase of a feedback signal and generate an error signal;
 a charge pump circuit configured to generate a current control signal in response to said error signal; and
 a loop filter circuit configured to generate the control signal in response to the current control signal.

8. A phase locked loop (PLL) circuit, comprising:
 a phase comparison circuit configured to compare phase of an input signal to phase of a feedback signal and generate a control signal responsive to the phase comparison;
 an oscillator circuit configured to generate an output signal at a frequency set by said control signal, where said feedback signal is derived from said output signal;
 wherein the oscillator circuit is configured to operate in a frequency locked loop (FLL) mode during a calibration mode of operation to compare frequency of the input signal to frequency of the output signal and center a gain of the oscillator circuit across process, voltage and temperature in response to the frequency comparison;
 wherein the phase comparison circuit comprises:
  a phase/frequency detector circuit configured to compare phase of an input signal to phase of a feedback signal and generate an error signal;
  a charge pump circuit configured to generate a current control signal in response to said error signal; and
  a loop filter circuit configured to generate the control signal in response to the current control signal;
 wherein the charge pump circuit comprises:

a pumping circuit configured to generate a current control signal in response to said error signal; and a bias circuit configured to generate a bias current applied to the pumping circuit;

wherein said bias circuit is configured during the calibration operation to calibrate the bias current to match a temperature independent reference current.

9. The PLL circuit of claim 8, wherein the bias circuit comprises:

a plurality of selectively actuated current source circuits each biased to generate a proportional to absolute temperature (PTAT) current; and a temperature independent current source circuit configured to generate the temperature independent reference current; and a control circuit operable in the calibration mode of operation and configured to control selective actuation of the current source circuits such that a sum of the PTAT currents matches the temperature independent reference current.

10. The PLL circuit of claim 9, wherein a number of the current source circuits selectively actuated during the calibration mode of operation remain actuated when not in the calibration mode of operation.

11. The PLL circuit of claim 1, further comprising a frequency divider circuit configured to generate said feedback signal by frequency dividing said output signal.

12. A phase locked loop (PLL) circuit, comprising:

a phase comparison circuit configured to compare phase of an input signal to phase of a feedback signal and generate a control signal responsive to the phase comparison;

an oscillator circuit configured to generate an output signal at a frequency set by said control signal, where said feedback signal is derived from said output signal;

wherein the oscillator circuit is configured to operate in a frequency locked loop (FLL) mode during a calibration mode of operation to compare frequency of the input signal to frequency of the output signal and center a gain of the oscillator circuit across process, voltage and temperature in response to the frequency comparison;

wherein the gain of the oscillator circuit exhibits a first temperature profile and wherein the phase comparison circuit comprises:

a phase/frequency detector circuit configured to compare phase of an input signal to phase of a feedback signal and generate an error signal; and a charge pump circuit configured to generate a current control signal in response to said error signal and a bias current signal that exhibits a second temperature profile which is configured to compensate for the first temperature profile.

13. The PLL circuit of claim 12, wherein the first temperature profile is complementary to absolute temperature (CTAT) and the second temperature profile is proportional to absolute temperature (PTAT).

14. A method of operating a phase locked loop (PLL) circuit, comprising:

operating the PLL circuit in a first mode of operation by:

comparing a phase of an input signal to phase of a feedback signal;

generating a control signal in response to the phase comparison; and setting a frequency of an output signal generated by an oscillator circuit in response to said control signal;

wherein said feedback signal is derived from said output signal;

wherein the oscillator circuit comprises a variable current source including a plurality of selectively actuated current source circuits each biased by a bias signal; and operating the PLL circuit if a second mode operation by:

controlling the oscillator circuit to operate in a frequency locked loop (FLL) mode to compare frequency of the input signal to frequency of the output signal; and centering a gain of the oscillator circuit across process, voltage and temperature in response to the frequency comparison;

further comprising:

applying the control signal as the bias signal during the first mode of operation; and applying a reference voltage as the bias signal during the second mode of operation.

15. The method of claim 14, wherein centering comprises calibrating a transconductance of the variable current source.

16. The method of claim 14, wherein each current source circuit comprises a current source and a switch coupled in series with each other, and centering comprises select actuation of the switch.

17. The method of claim 14, wherein centering comprises actuating an FLL control loop to control the selective actuation of the current source circuits in response to the frequency comparison of the output signal to the input signal.

18. The method of claim 14, wherein a number of the current source circuits selectively actuated during the second mode of operation remain actuated when in first mode of operation.

19. A method of operating a phase locked loop (PLL) circuit, comprising:

operating the PLL circuit in a first mode of operation by:

comparing a phase of an input signal to phase of a feedback signal;

generating a control signal in response to the phase comparison; and setting a frequency of an output signal generated by an oscillator circuit in response to said control signal;

wherein said feedback signal is derived from said output signal; and operating the PLL circuit if a second mode operation by:

controlling the oscillator circuit to operate in a frequency locked loop (FLL) mode to compare frequency of the input signal to frequency of the output signal; and centering a gain of the oscillator circuit across process, voltage and temperature in response to the frequency comparison;

wherein phase comparing comprises using a charge pump circuit to generate a current control signal, said charge pump circuit including a bias circuit configured to generate a bias current, wherein operating in said second mode of operation further comprises: calibrating the bias current to match a temperature independent reference current.

20. The method of claim 19, wherein the bias circuit comprises a plurality of selectively actuated current source circuits each biased to generate a proportional to absolute temperature (PTAT) current, and calibrating comprises: controlling selective actuation of the current source circuits such that a sum of the PTAT currents matches the temperature independent reference current.

21. The method of claim 20, wherein a number of the current source circuits selectively actuated during the second mode of operation remain actuated when in first mode of operation.

22. The method of claim 14, further comprising generating said feedback signal by frequency dividing said output signal.

23. A method of operating a phase locked loop (PLL) circuit, comprising:
- operating the PLL circuit in a first mode of operation by:
  - comparing a phase of an input signal to phase of a feedback signal;
  - generating a control signal in response to the phase comparison; and
  - setting a frequency of an output signal generated by an oscillator circuit in response to said control signal;
  - wherein said feedback signal is derived from said output signal; and
- operating the PLL circuit if a second mode operation by:
  - controlling the oscillator circuit to operate in a frequency locked loop (FLL) mode to compare frequency of the input signal to frequency of the output signal; and
- centering a gain of the oscillator circuit across process, voltage and temperature in response to the frequency comparison;
- wherein the gain of the oscillator circuit exhibits a first temperature profile and wherein comparing comprises using a charge pump circuit to generate a current control signal, said charge pump circuit including a bias circuit configured to generate a bias current that exhibits a second temperature profile which is configured to compensate for the first temperature profile.

24. The method of claim 23, wherein the first temperature profile is complementary to absolute temperature (CTAT) and the second temperature profile is proportional to absolute temperature (PTAT).

\* \* \* \* \*